(12) United States Patent
Fukuhara (10) Patent No.: US 11,092,622 B2
(45) Date of Patent: Aug. 17, 2021

(54) CURRENT DETECTION DEVICE

(71) Applicant: Yazaki Corporation, Tokyo (JP)

(72) Inventor: Toshiaki Fukuhara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/677,885

(22) Filed: Nov. 8, 2019

(65) Prior Publication Data

US 2020/0158760 A1 May 21, 2020

(30) Foreign Application Priority Data

Nov. 15, 2018 (JP) .............................. JP2018-214640

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01)

(58) Field of Classification Search
CPC ................ G01R 15/202; G01R 15/207; G01R 19/0092; G01R 1/18
See application file for complete search history.

(56) References Cited

U.S. PATENT DOCUMENTS

| | | | |
|---|---|---|---|
| 6,963,195 B1 * | 11/2005 | Berkcan | G01R 15/181 324/117 R |
| 9,285,401 B2 * | 3/2016 | Kawaguchi | G01R 19/15 |
| 2011/0050249 A1 * | 3/2011 | Maeda | G01R 31/364 324/649 |
| 2012/0206225 A1 | 8/2012 | Misaki | |
| 2013/0154617 A1 * | 6/2013 | Kawaguchi | G01R 19/15 324/156 |
| 2015/0204915 A1 * | 7/2015 | Okuyama | G01R 19/0092 324/117 R |
| 2017/0018920 A1 | 1/2017 | Tozawa et al. | |
| 2017/0125151 A1 * | 5/2017 | Hamamura | G01R 33/063 |
| 2017/0131329 A1 * | 5/2017 | Gorai | G01R 15/207 |

FOREIGN PATENT DOCUMENTS

| | | |
|---|---|---|
| JP | 2011-089899 A | 5/2011 |
| JP | 2017-026392 A | 2/2017 |
| JP | 2017-215143 A | 12/2017 |

* cited by examiner

*Primary Examiner* — Dominic E Hawkins
(74) *Attorney, Agent, or Firm* — Sughrue Mion, PLLC (57) ABSTRACT

In a current detection device, a busbar extends through the interior of a shield member. The busbar is thin in thickness and yet is bent, when viewed in a direction of extension. A current sensor detects a magnetic field generated by an electric current flowing in the busbar.

9 Claims, 12 Drawing Sheets

CURRENT DETECTION DEVICE

BACKGROUND

Technical Field

The present disclosure relates to a current detection device, and more particularly to a current detection device that detects an electric current flowing in a busbar by detecting a magnetic field generated by the electric current flowing in the busbar.

Related Art

A conventional current detection device includes a busbar, a shield member, and a current sensor.

The current detection device is configured to detect the value of an electric current flowing in a shield member as a result of a current sensor detecting a magnetic field that is generated when the electric current is flowing in the shield member (JP 2017-215143 A).

SUMMARY

When the value of the electric current flowing in the busbar of the current detection device is large, the cross-sectional area of the busbar must be made large.

However, when productivity is considered, the thickness of the busbar (dimensional value in a vertical direction) cannot be large. For example, when the busbar thickness exceeds 3 mm, processing such as presswork is difficult, and productivity deteriorates.

Instead of increasing the busbar thickness, enlarging the lateral dimension (the dimensional value in a crosswise direction) of the busbar may be considered. However, when the busbar width is made large, there is a problem in that the lateral dimension of the current detection device (the shield member) ends up being large.

An object of the present disclosure is to provide a current detection device capable of detecting a large electric current without reducing productivity.

An embodiment of the present disclosure provides a current detection device that includes a shield member, a busbar that extends through the interior of the shield member and which is thin in thickness and bent when viewed in a direction of extension, and a current sensor that detects a magnetic field generated by an electric current flowing in the busbar.

The foregoing configuration affords the effect of making it possible to provide a current detection device capable of detecting a large electric current without reducing productivity.

DETAILED DESCRIPTION OF EMBODIMENT

Figure 1:
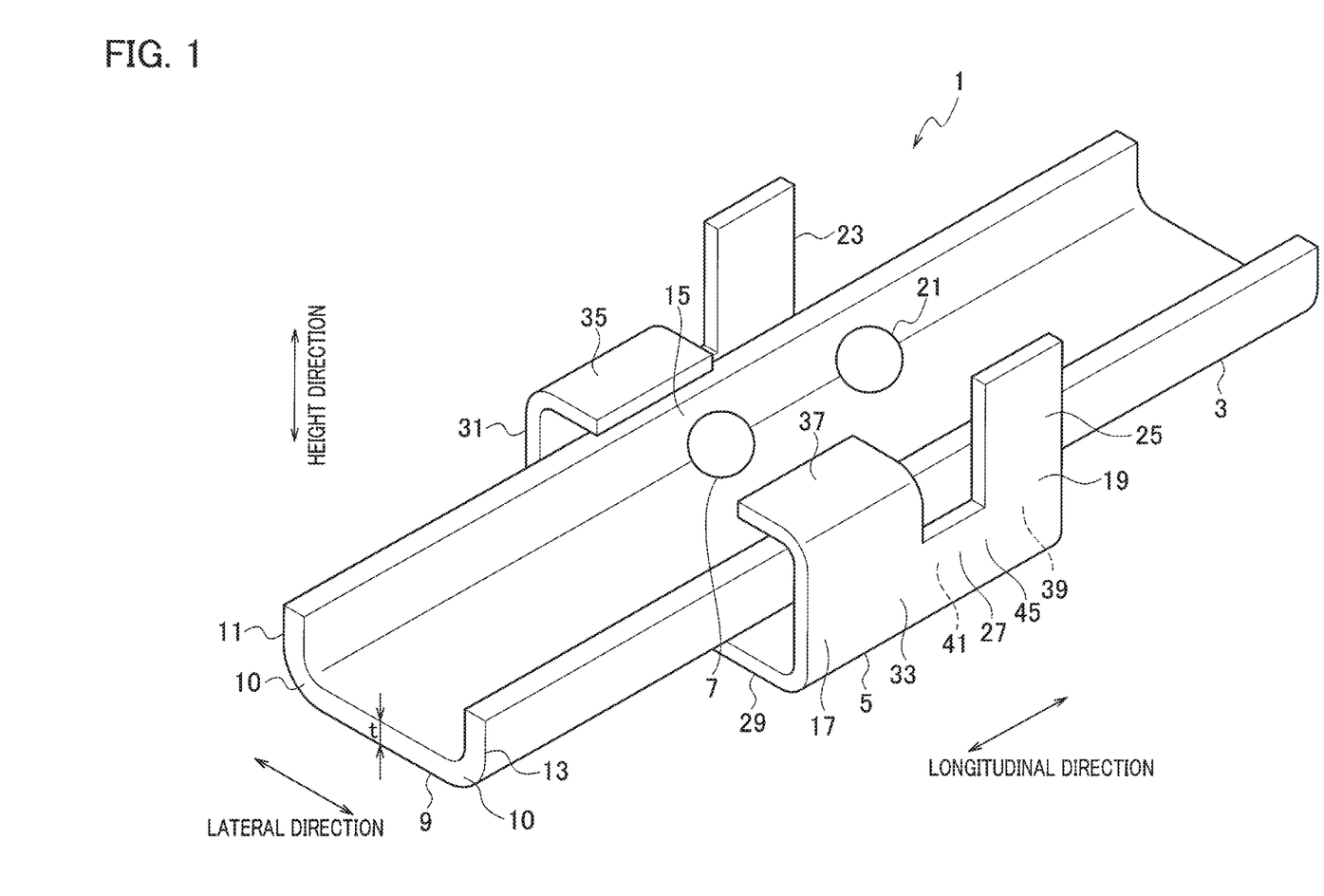
FIG. 1 is a perspective view of a current detection device according to an embodiment of the present disclosure.
Figure 2A:
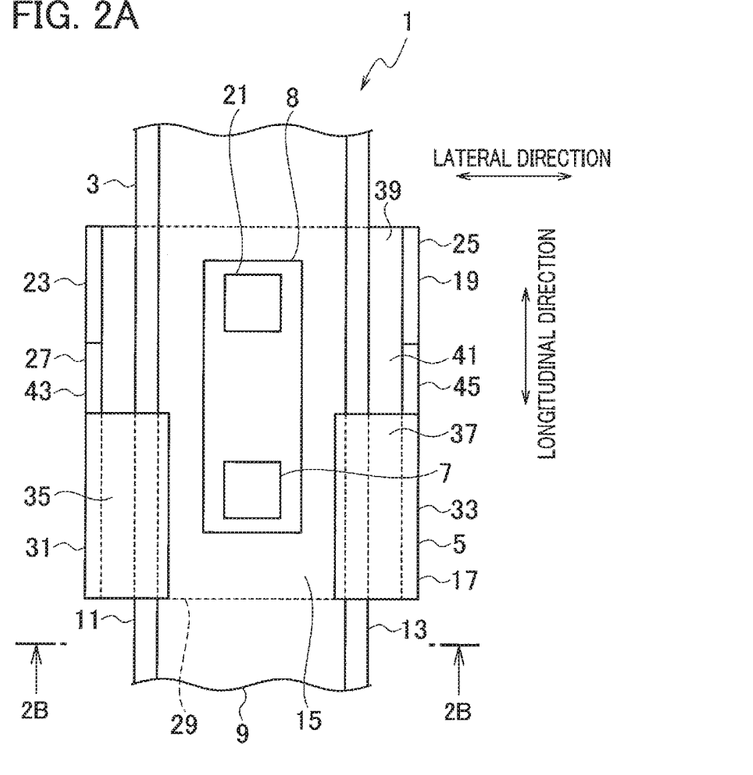
FIG. 2A is a plan view of the current detection device according to the embodiment of the present invention.
Figure 2B:
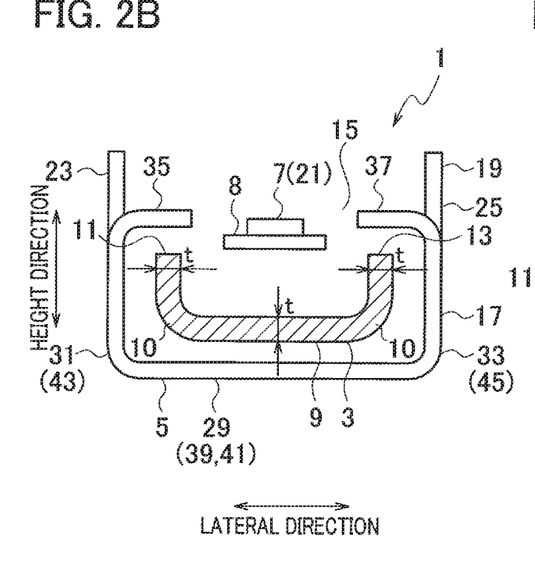
FIG. 2B is a cross-sectional view of a cross section 2B-2B in FIG. 2A.

A current detection device 1 according to the embodiment of the present disclosure detects an electric current flowing in a busbar 3 by detecting a magnetic field 55 (see FIG. 4) generated by the electric current flowing in the busbar 3. The current detection device 1 includes the busbar 3, a shield member 5, and a current sensor (magnetic field detecting element; Hall IC) 7, as illustrated in FIGS. 1, 2A, and 2B.

To facilitate the explanation, a predetermined direction is a longitudinal direction, a predetermined direction that is orthogonal to the longitudinal direction is a lateral direction, and a direction that is orthogonal to the longitudinal direction and lateral direction is a height direction.

The shield member 5 is configured from a ferromagnetic body (permalloy, for example, which is an alloy of iron and nickel). The shield member 5 includes a second portion 19 in addition to a first portion 17. The first portion 17 and second portion 19 are arranged at both ends of the shield member 5 and spaced apart in the longitudinal direction. The first portion 17 is formed in a box shape (or a ring shape)

with an opening (cutout) 15 at the top when viewed in the longitudinal direction. The second portion 19 is formed in a U shape when viewed in the longitudinal direction (see FIGS. 1, 2A, and 2B).

The busbar 3 is configured from a conductor, and extends in the longitudinal direction (in the direction of extension) through the box-shaped interior of the shield member 5. That is, the busbar 3 extends far in the longitudinal direction, passing through the shield member 5 while not making contact with the shield member 5.

An electric current flows from one end to the other end of the busbar 3 in the longitudinal direction. Furthermore, when the busbar 3 is viewed in the direction of extension (longitudinal direction), same has a thin thickness t and is bent in a U shape, for example, as illustrated in FIG. 2B. Note that the busbar 3 is bent to prevent a large lateral dimension, for example. The busbar 3 is bent at bends 10 at two points.

When viewed in the longitudinal direction, the busbar 3 is bent in at least one portion thereof, and extends in the lateral direction and height direction, for example, as illustrated in FIG. 2B. The value of the thickness dimension t of the busbar 3 when viewed in the longitudinal direction is a value at which presswork and bending work is straightforward (a value of 3 mm or less).

Note that, in the foregoing bending, the busbar 3 is bent at an angle of 90°, for example, at the bends 10, when viewed in the longitudinal direction. In this example, the bends 10 of the busbar 3 are curved.

A current sensor 7 is provided on a wiring board (circuit substrate) 8, and is configured to detect the magnetic flux density of the magnetic field 55 (see FIG. 4) generated by the current flowing in the busbar 3. Further, for example, the magnetic flux density detected by the current sensor 7 is converted to a current value by the wiring board 8 such that the value of the current flowing in the busbar 3 is detected.

Note that the value of the dimension of the busbar 3 in the longitudinal direction is larger than the value of the dimension of the shield member 5 in the longitudinal direction, as illustrated in FIGS. 1, 2A, and 2B. When viewed in the height direction and width direction, the busbar 3 is arranged at a midpoint of the shield member 5. In addition, when viewed in the height and width direction, the current sensor 7 is arranged in the middle of the shield member 5.

To explain this more fully, when viewed in the longitudinal direction, the busbar 3 is formed in a U shape as described earlier, as illustrated in FIG. 2B. In other words, when viewed in the longitudinal direction, the busbar 3 is formed in a U shape, having a base plate portion 9 and a pair of side plate portions 11 and 13. In addition, when viewed in the longitudinal direction, the base plate portion 9 is formed in a rectangular shape with a long and narrow cross section in the lateral direction, and the value of its dimension in the height direction (thickness dimension) t is sufficiently small in comparison with the value of its dimension in the lateral direction, having a value of 3 mm or less, for example, as described earlier.

When viewed in the longitudinal direction, one side plate portion 11 of the pair of side plate portions is formed in a rectangular shape with a long and narrow cross section in the height direction, and stands upward in the height direction from one lateral end of the base plate portion 9. In addition, when viewed in the longitudinal direction, for one side plate portion 11, the value of its dimension in the lateral direction (thickness dimension) t is sufficiently small in comparison with the value of its dimension in the height direction, having a value of 3 mm or less, for example, as described earlier, which is equal to the value of the height dimension t of the base plate portion 9.

When viewed in the longitudinal direction, the other side plate portion 13 of the pair of side plate portions is formed with the same shape as the one side plate portion 11, and stands upward, from the other lateral end of the base plate portion 9, in the height direction at the same height as the one side plate portion 11.

The busbar 3 is formed in a U shape when viewed in the longitudinal direction because same is bent at a right angle at the bends 10 at two points, namely, at the boundary between the base plate portion 9 and the one side plate portion 11, and at the boundary between the base plate portion 9 and the other side plate portion 13.

To explain this more fully, the busbar 3 is formed by bending a rectangular, long and narrow blank with a flat plate shape, whose thickness dimension is 3 mm or less, along two linear bend lines (by plastically deforming same through angular bending at an angle on the order of 90°). The two linear bend lines are spaced apart and run parallel to one another, and extend in the longitudinal direction of the long and narrow, flat plate-shaped blank.

Furthermore, in the foregoing explanation, the value of the dimension of erection of the one side plate portion 11 from the base plate portion 9 (the height dimension) and the value of the dimension of erection of the other side plate portion 13 from the base plate portion 9 (the height dimension) coincide with one another. The value of the dimension of erection of the one side plate portion and the value of the dimension of erection of the other side plate portion may also differ.

When viewed in the longitudinal direction, the current sensor 7 is provided outside the U shape of the busbar 3, as illustrated in FIG. 2B.

In other words, when viewed in the longitudinal direction, the busbar 3 is formed in a U shape, having the base plate portion 9 and the pair of side plate portions 11 and 13, as described earlier. When four segments link together a point on the boundary between the base plate portion 9 and the one side plate portion 11, a point at the tip (upper end) of the one side plate portion 11, a point at the tip (upper end) of the other side plate portion 13, and a point at the boundary between the base plate portion 9 and the other side plate portion 13, a rectangle enclosing a U shape exactly therein is formed. When viewed in the longitudinal direction, the current sensor 7 is provided outside the foregoing rectangle and spaced apart from the rectangle.

When viewed in the longitudinal direction, the shield member 5 is formed in a ring shape (a box shape) with a portion thereof cut away by providing an opening (cutout) 15 in a portion of the shield member 5, as illustrated in FIG. 2B. Furthermore, when viewed in the longitudinal direction, the busbar 3 is arranged inside the ring of the shield member 5 and spaced apart from the wall surface of the shield member 5, as described earlier.

The current sensor 7 is configured to detect the magnetic field 55 (see FIG. 4) at the opening 15 of the shield member 5 or the magnetic field 55 in the vicinity of the opening 15 of the shield member 5.

Note that, in the aspect illustrated in FIG. 2B, the current sensor 7 is provided in the center of the opening 15 in the lateral direction, and is provided slightly lower than the opening 15 (inside a first portion 17 of the shield member 5) in the height direction. Note that the current sensor 7 is arranged inside the shield member 5 in the longitudinal direction.

Figure 2C:
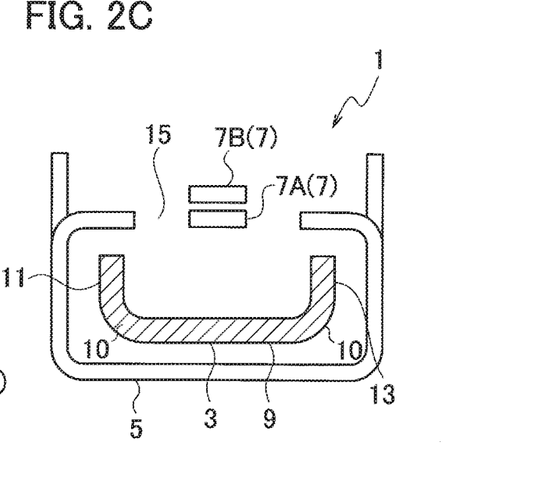
FIG. 2C is a cross-sectional view corresponding to FIG. 2B and illustrating a state where the position of the current sensor has been changed.

As illustrated in FIG. 2C, the position of the current sensor 7 may be suitably changed in the height direction, for example. That is, the current sensor 7 may also be provided in the position (at the point of the opening 15) denoted by reference sign 7A in FIG. 2C, or may be provided in the position (slightly higher than the opening 15; outside the shield member 5) denoted by reference sign 7B in FIG. 2C.

To explain this more fully, the current sensor (first current sensor) 7 is fitted to the first portion 17 (see FIGS. 1 and 2A) of the shield member 5. The first portion 17 of the shield member 5 is formed in a ring shape with a portion thereof cut away, when viewed in the longitudinal direction, by providing the opening 15 in a portion of the first portion 17, as described earlier (see FIG. 2B).

A current sensor (second current sensor) 21 is also provided to the second portion 19 of the shield member 5. Thus, the current detection device 1 is provided with at least two current sensors 7 and 21. The current sensor 21 is electrically connected to a current detection circuit 1a.

The first current sensor of the two current sensors (the first current sensor) 7 is configured to detect, in the first portion 17, the magnetic field 55 at the opening 15 of the shield member 5 or the magnetic field 55 in the vicinity of the opening 15 of the shield member 5, as mentioned earlier.

The other current sensor of the two current sensors (the second current sensor) 21 is configured to detect, in the second portion 19 of the shield member 5 in the longitudinal direction, the magnetic field between a pair of side plate portions 23 and 25 which form a U shape.

To describe this in more detail, the shield member 5 is formed as a result of a flat plate-shaped blank of a predetermined suitable shape assuming a state of being suitably bent along a plurality of linear bend lines.

Moving from one end of the shield member 5 to the other end in the longitudinal direction, the first portion 17, a middle portion 27, and the second portion 19 are arranged in that order.

As mentioned earlier, when viewed in the longitudinal direction, the first portion 17 is formed in a rectangular ring shape in which an opening 15 is provided in a portion thereof, as illustrated in FIG. 2B and so forth. The second portion 19 is formed in a U shape when viewed in the longitudinal direction, and the middle portion 27 is also formed in a U shape when viewed in the longitudinal direction.

When viewed in the longitudinal direction, the first portion 17 includes a base plate portion 29, a pair of side plate portions 31 and 33 that stand erect from both ends of the base plate portion 29, and a pair of upper plate portions 35 and 37 that run parallel to the base plate portion 29 from the respective tips of the pair of side plate portions 31 and 33 and which extend in a direction approaching one another.

The second portion 19 includes a base plate portion 39, and a pair of side plate portions 23 and 25 that stand erect from both ends of the base plate portion 39.

The middle portion 27 includes a base plate portion 41, and a pair of side plate portions 43 and 45 that stand erect from both ends of the base plate portion 41.

In addition, when viewed in the longitudinal direction, the base plate portion 29 of the first portion 17, the base plate portion 39 of the second portion 19, and the base plate portion 41 of the middle portion 27 coincide with one another.

The value of the erection height from the base plate portion 39 of the pair of side plate portions 23 and 25 of the second portion 19 is larger than the value of the erection height from the base plate portion 29 of the pair of side plate portions 31 and 33 of the first portion 17. The value of the erection height from the base plate portion 29 of the pair of side plate portions 31 and 33 of the first portion 17 is larger than the value of the erection height from the base plate portion 41 of the pair of side plate portions 43 and 45 of the middle portion 27.

Furthermore, when viewed in the longitudinal direction, the tips of the pair of upper plate portions 35 and 37 of the first portion 17 are spaced apart from one another in the lateral direction, and the first portion 17 is formed in a rectangular ring shape with a portion thereof cut away.

In addition, when viewed in the longitudinal direction, the value of the lateral dimension of the one upper plate portion 35 of the first portion 17 and the value of the lateral dimension of the other upper plate portion 37 of the first portion 17 coincide with one another.

The first current sensor 7 is arranged inside the first portion 17 in the longitudinal direction and is provided in the center of the gap (opening) 15 which is formed between the pair of upper plate portions 35 and 37 in the lateral direction. Furthermore, the first current sensor 7 may be provided at the height of the pair of upper plate portions 35 and 37 as described earlier, or may be provided slightly lower than the pair of upper plate portions 35 and 37 or provided slightly higher than the pair of upper plate portions 35 and 37.

The second current sensor 21 is arranged inside the second portion 19 in the longitudinal direction and is provided in the center of the gap which is formed between the pair of side plate portions 23 and 25 of the second portion 19 in the lateral direction. In addition, the second current sensor 21 is provided at the same point as the first current sensor 7 in the height direction, and, as per the first current sensor 7, the location of the second current sensor 21 can be slightly changed. The second current sensor 21 is not arranged higher than the upper ends of the pair of side plate portions 23 and 25 of the second portion 19.

Figure 12A:
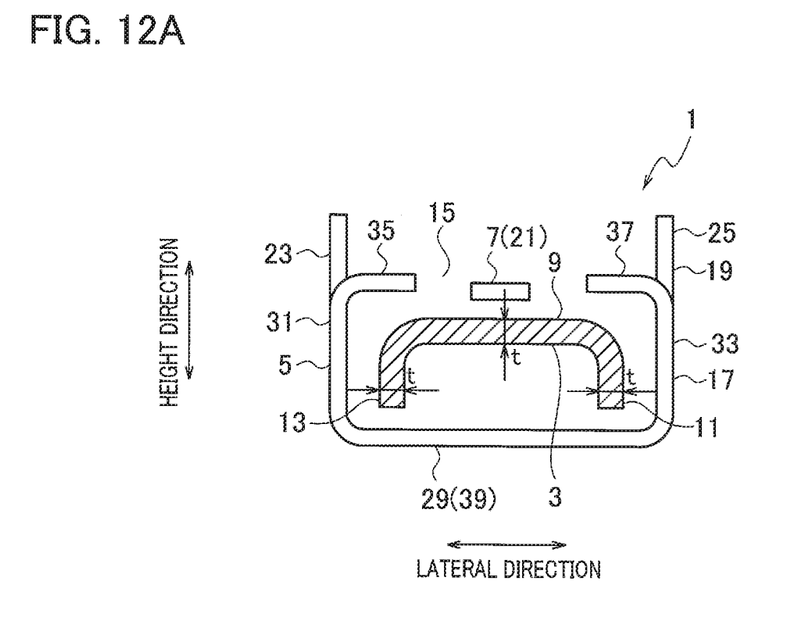
FIGS. 12A and 12B are cross-sectional views corresponding to FIG. 2B, in which the attitude and so forth of the busbar has been changed.
Figure 12B:
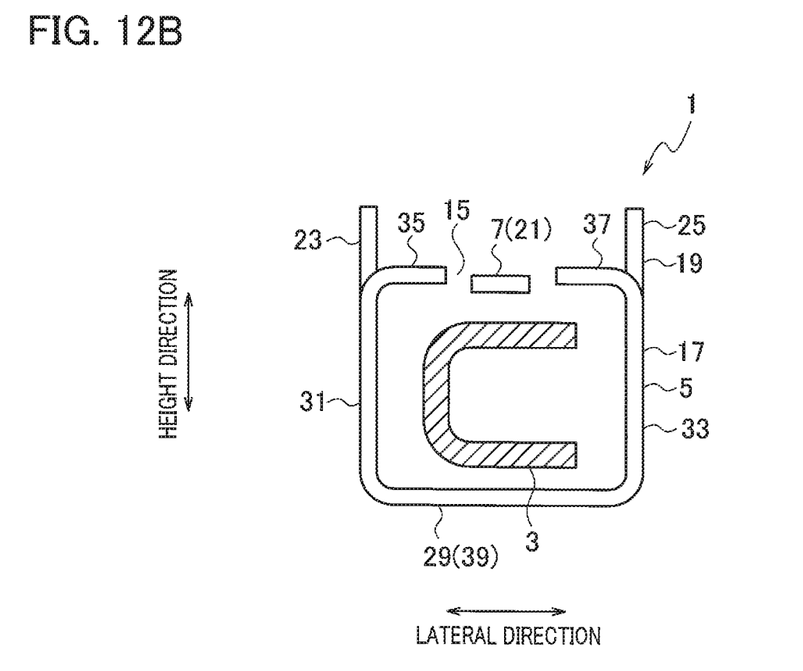

When viewed in the longitudinal direction, the busbar 3 is arranged at a midpoint inside the shield member 5. Note that, as illustrated in FIGS. 12A and 12B, the attitude of the U-shaped busbar 3 may be suitably changed. In the aspect illustrated in FIG. 12A, the busbar 3 has been rotated 180° relative to the aspect illustrated in FIG. 2B, and the base plate portion 9 is arranged higher than the side plate portions 11 and 13.

In the aspect illustrated in FIG. 12B, the busbar 3 has been rotated 90° about the longitudinal direction relative to the aspect illustrated in FIG. 2B, and the side plate portions 11 and 13 extend in the lateral direction from the base plate portion 9. In addition, the busbar 3 may also be configured in an aspect in which same has been rotated through any angle about the longitudinal direction, relative to the aspect illustrated in FIG. 2B.

The fitting of the busbar 3 to other busbars (partner busbars) 47 and 49 will be explained next with reference to FIG. 11.

Figure 11:
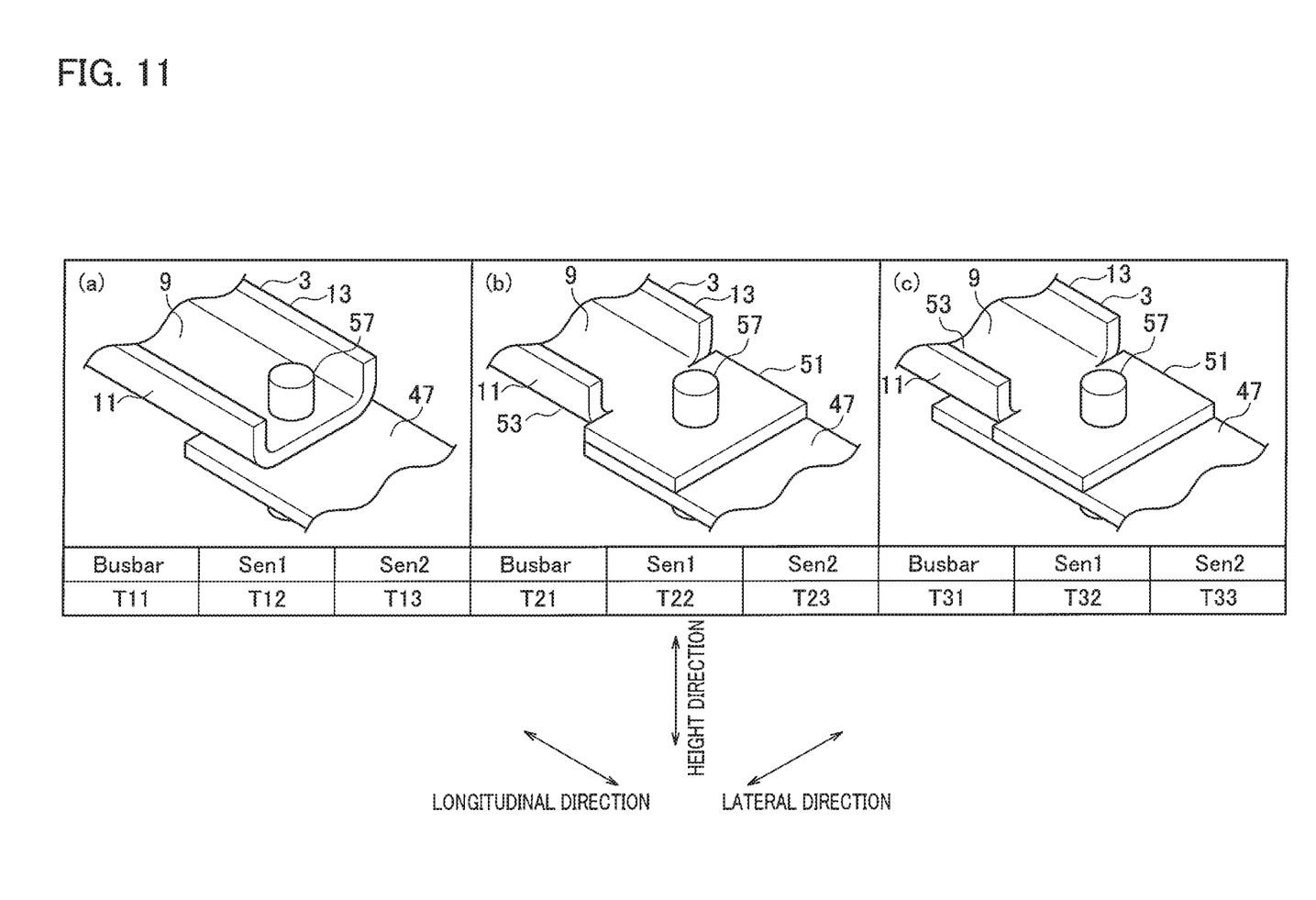
FIG. 11 is a perspective view illustrating states in which the busbar of the current detection device according to the embodiment of the present disclosure and a busbar according to a modified example are each connected to a partner busbar, and a table showing a temperature rise in the respective states.

As illustrated in (a) of FIG. 11, one end of the busbar 3 in the longitudinal direction (one end with a predetermined length) is connected to the partner busbar 47 by using a fastener such as a bolt 57.

The upper face of the partner busbar 47 is a rectangular flat face with predetermined dimensions in the longitudinal direction and lateral direction, for example. The bottom face (lower face) of the base plate portion 9 of the one end of the busbar 3 in the longitudinal direction makes surface contact with the upper face of the partner busbar 47. Note that the value of the lateral dimension of the upper face of the partner busbar 47 is larger than the lateral value of the bottom face of the busbar 3, and the core of the busbar 3 and the core of the partner busbar 47 coincide with one another in the lateral direction.

The other end of the busbar 3 in the longitudinal direction is also connected to the partner busbar 49 by using a fastener such as a bolt 57, similarly to the one end.

Note that the aspect of the fitting of the busbar 3 to other busbars (partner busbars) 47 and 49 may also be changed as illustrated in (b) and (c) of FIG. 11. So too in the aspects illustrated in (b) and (c) of FIG. 11, the upper face of the partner busbar 47 is a rectangular flat face with predetermined dimensions in the longitudinal direction and lateral direction, for example.

In the aspect illustrated in (b) of FIG. 11, one end of the busbar 3 in the longitudinal direction (one end with a predetermined length) is formed in a rectangular flat plate shape.

Furthermore, the bottom face (lower face) of the base plate portion 9 of the one end of the busbar 3 in the longitudinal direction makes surface contact with the upper face of the partner busbar 47 (49). Note that the value of the lateral dimension of the upper face of the partner busbar 47 (49) and the lateral value of the bottom face of the busbar 3 are equal to one another, and the core of the busbar 3 and the core of the partner busbar 47 (49) coincide with one another in the lateral direction.

In the aspect illustrated in (c) of FIG. 11, one end of the busbar 3 in the longitudinal direction (one end with a predetermined length) is configured from a tip-side portion 51 which is formed in a rectangular flat plate shape and a base end-side portion 53 which is formed in a U shape.

Furthermore, the bottom face (lower face) of the base plate portion 9 of the base end-side portion 53 of the busbar 3 and the lower face of the tip-side portion 51 of the busbar 3 make surface contact with the upper face of the partner busbar 47 (49). Note that the value of the lateral dimension of the upper face of the partner busbar 47 (49) and the value of the lateral dimension of the tip-side portion 51 of the busbar 3 are equal to one another, and the core of the busbar 3 and the core of the partner busbar 47 (49) coincide with one another in the lateral direction.

Furthermore, the value of the lateral dimension of the base plate portion 9 of the base end-side portion 53 is smaller than the value of the lateral dimension of the tip-side portion 51, and the core of the tip-side portion 51 and the core of the base end-side portion 53 coincide with one another in the lateral direction.

Operation of the current detection device 1 will be explained next.

Figure 4:
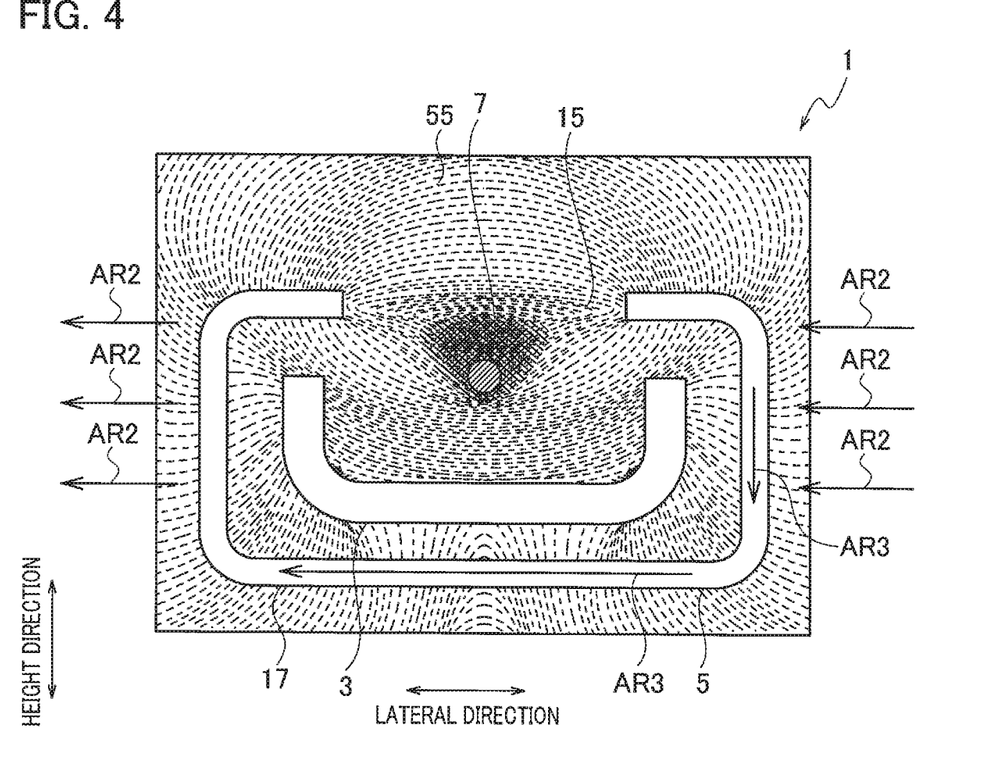
FIG. 4 is a diagram corresponding to FIG. 2B and illustrating a current detection device according to the embodiment of the present disclosure, and a magnetic field.

When current flows in the busbar 3 of the current detection device 1, the magnetic field 55 is generated as illustrated in FIG. 4. The magnetic flux density of the magnetic field 55 varies according to the value of the current flowing in the busbar 3, and is large at the opening 15 of the shield member 5 except for the solid portion of the shield member 5. The first current sensor 7 detects the magnetic flux density at the opening 15 of the shield member 5, the magnetic flux density is converted to a current value by the wiring board 8, and the value of the current flowing in the busbar 3 is determined.

The value of the current flowing in the busbar 3 can also be determined by the second current sensor 21 in the same way by as the first current sensor 7. However, the value of the magnetic flux density generated between the pair of side plate portions 23 and 25 of the second portion 19 is smaller than the magnetic flux density generated by the opening 15 of the first portion 17. Therefore, the value of a small electric current flowing in the busbar 3 is determined by the first current sensor 7, and the value of a large electric current flowing in the busbar 3 is determined by the second current sensor 21.

Figure 5:
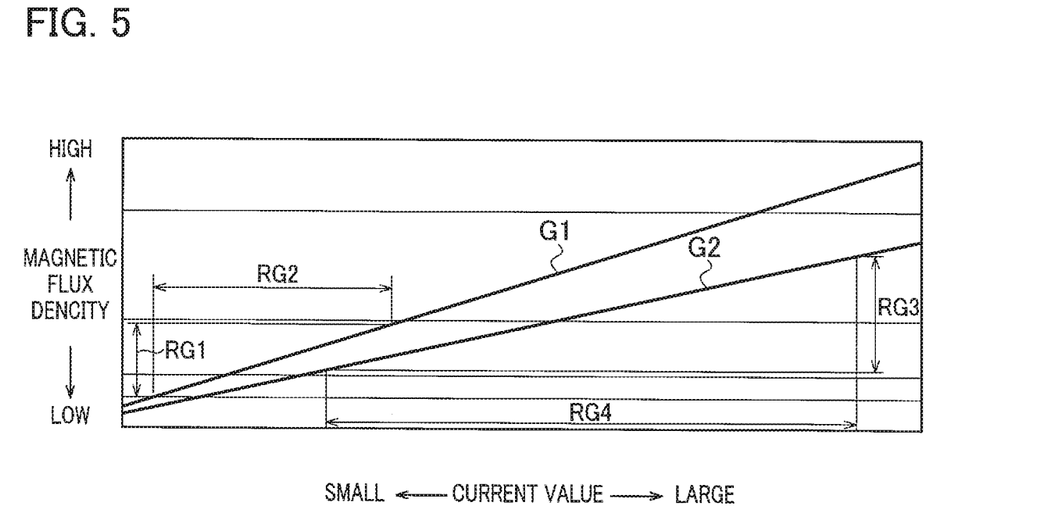
FIG. 5 is a diagram illustrating a relationship between an electric current flowing in a busbar of the current detection device according to the embodiment of the present disclosure, and magnetic flux density.

Here, the relationship between the electric current values in the first current sensor 7 and the second current sensor 21 and the magnetic flux density will be explained with reference to FIG. 5. The graph G1 illustrated in FIG. 5 is for the first current sensor 7, and the graph G2 illustrated in FIG. 5 is for the second current sensor 21.

As a result of the first current sensor 7 detecting the magnetic flux density in a range RG1, the value of a current in a range RG2 that flows in the busbar 3 can be measured. As a result of the second current sensor 21 detecting the magnetic flux density in a range RG3, the value of a current in a range RG4 that flows in the busbar 3 can be measured. Note that graphs G1 and G2 are linear (exhibit linearity).

Figure 6:
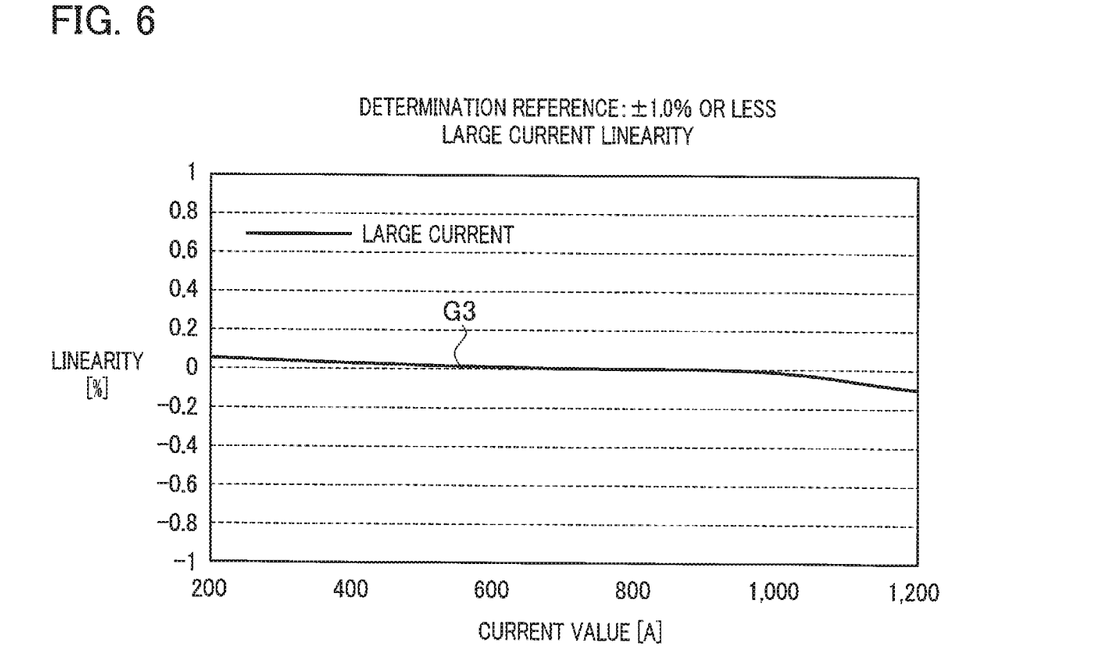
FIG. 6 is a diagram illustrating linearity of an electric current flowing in the busbar of the current detection device according to the embodiment of the present disclosure.

Linearity is exhibited when the value of the current flowing in the busbar 3 is large, and this linearity is favorable as illustrated in graph G3 in FIG. 6.

A temperature variation in the current detection device 1 when a fixed current flows continuously in the busbar 3 will be explained next with reference to FIG. 7. Measurement of the temperature of the current detection device 1 is taken at three points, namely, the busbar 3, the first current sensor 7, and the second current sensor 21.

Figure 7:
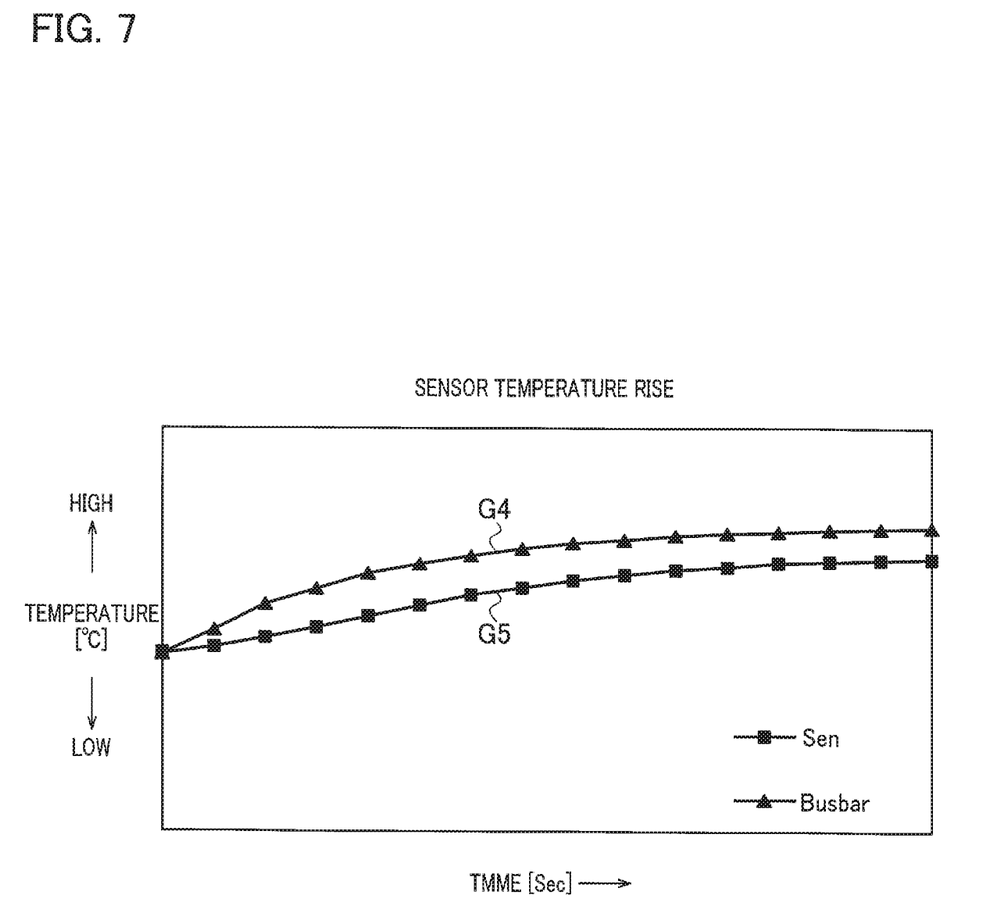
FIG. 7 is a diagram illustrating a temperature rise in the current detection device according to the embodiment of the present disclosure.

Graph G4, which is illustrated in FIG. 7, illustrates the temperature variation (temperature rise) of the busbar 3, and graph G5, which is illustrated in FIG. 7, illustrates the temperature variation (temperature rise) of the first current sensor 7 and second current sensor 21. There are no particular problems caused by a temperature rise.

Next, a variation in the magnetic flux density in a case where the dimensions of the U-shaped busbar 3 are changed and a fixed current flows in the busbar 3 will be explained next with reference to FIG. 8.

Figure 8:
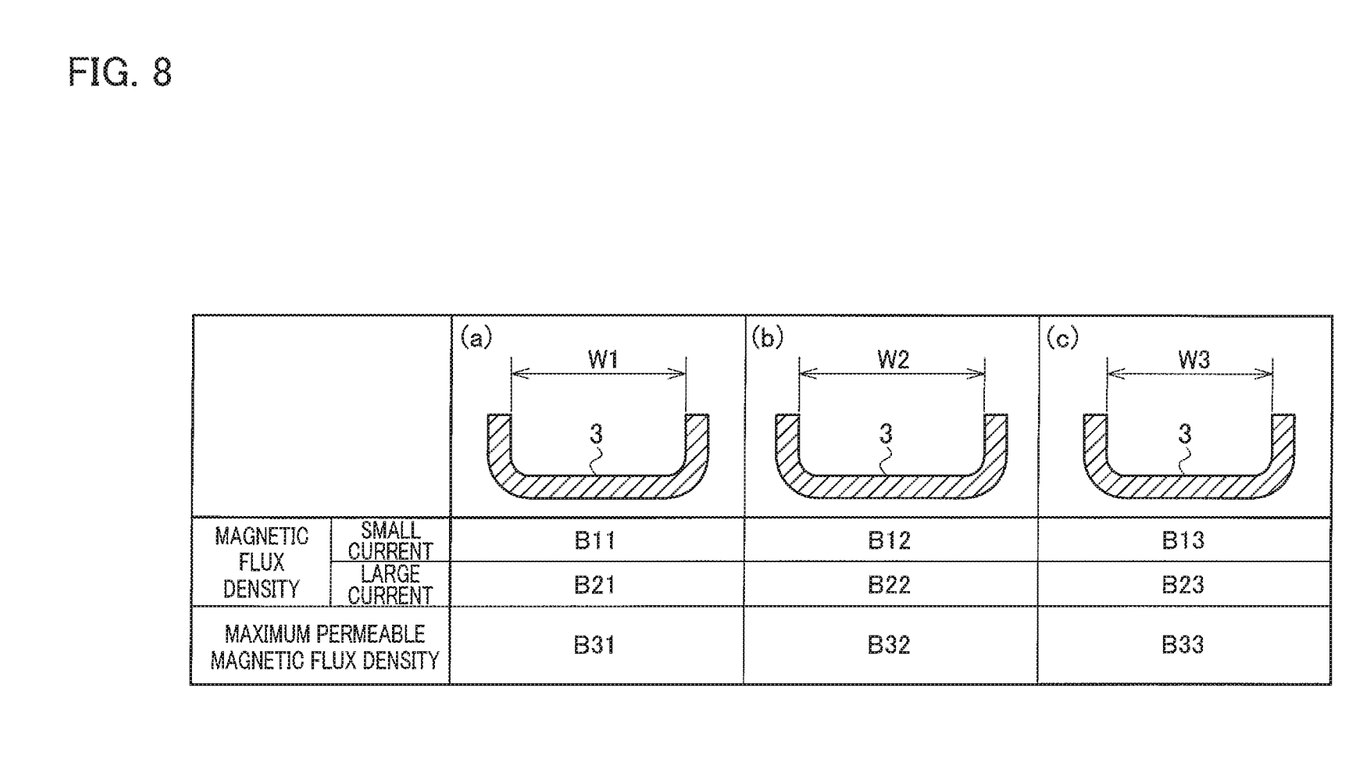
FIG. 8 is a diagram illustrating a relationship between various shapes of busbar of the current detection device according to the embodiment of the present disclosure, and magnetic flux density.

Note that "B11", "B12", and "B13" in FIG. 8 are magnetic flux densities at points of the first current sensor 7, and "B21", "B22", and "B23" are magnetic flux densities at points of the second current sensor 21.

Note that the sizes of the dimensions "W1", "W2", and "W3" illustrated in FIG. 8 are such that W2>W1>W3, but the differences between these dimensions are small and no more than a few percent. The sizes of the values "B11", "B12", and "B13" of the magnetic flux densities illustrated in FIG. 8 are such that B13>B11>B12, but the differences between these values are small and no more than a few percent. Furthermore, the sizes of the values of the magnetic flux densities "B21", "B22", and "B23" illustrated in FIG. 8 are such that B23>B21>B22, but the differences between these values are small and no more than a few percent.

"B31", "B32", and "B33" in FIG. 8 are the maximum magnetic flux densities in the shield member 5. Referring to FIG. 8, even when the dimensions of the U-shaped busbar 3 are changed, there is barely any change in the magnetic flux density. That is, the sizes of the "B31", "B32", and "B33" illustrated in FIG. 8 are approximately equal to one another.

Incidentally, when the busbar 3 is afforded a U shape, the surface area of contact between the busbar 3 and the partner busbars 47 and 49 (more precisely, the surface area of the portions of the busbar 3 that are connected to the partner busbars 47 and 49) is small. Thus, a current density distribution and heat generation will be explained with reference to FIGS. 9, 10 and 11.

Figure 9:
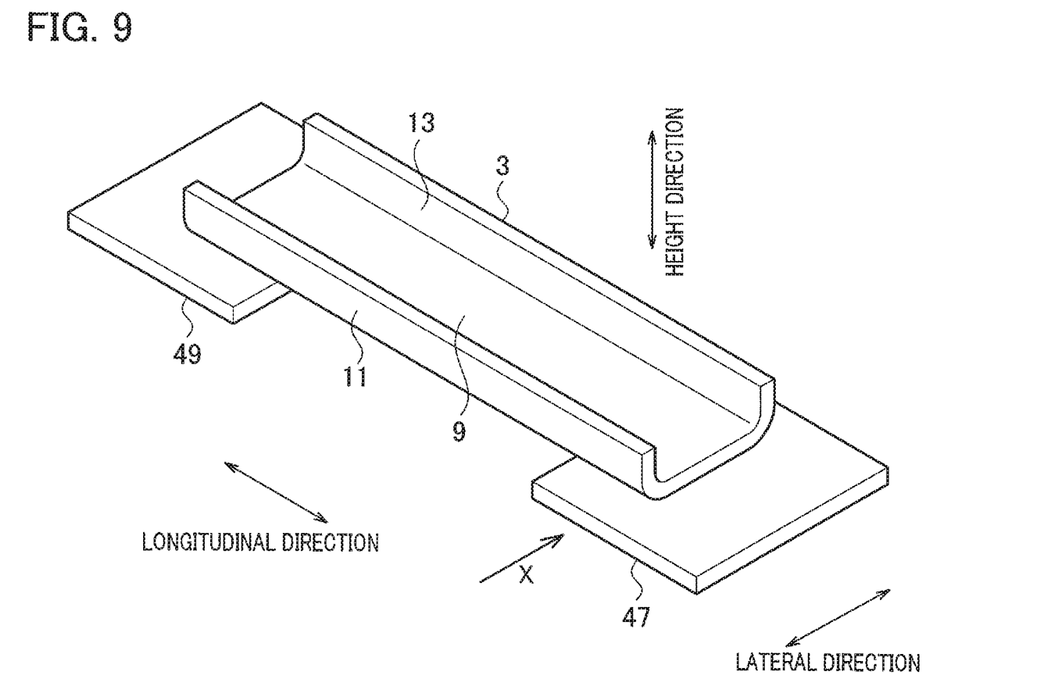
FIG. 9 is a perspective view illustrating a state where the busbar of the current detection device according to the embodiment of the present disclosure is connected to a partner busbar.
Figure 10:
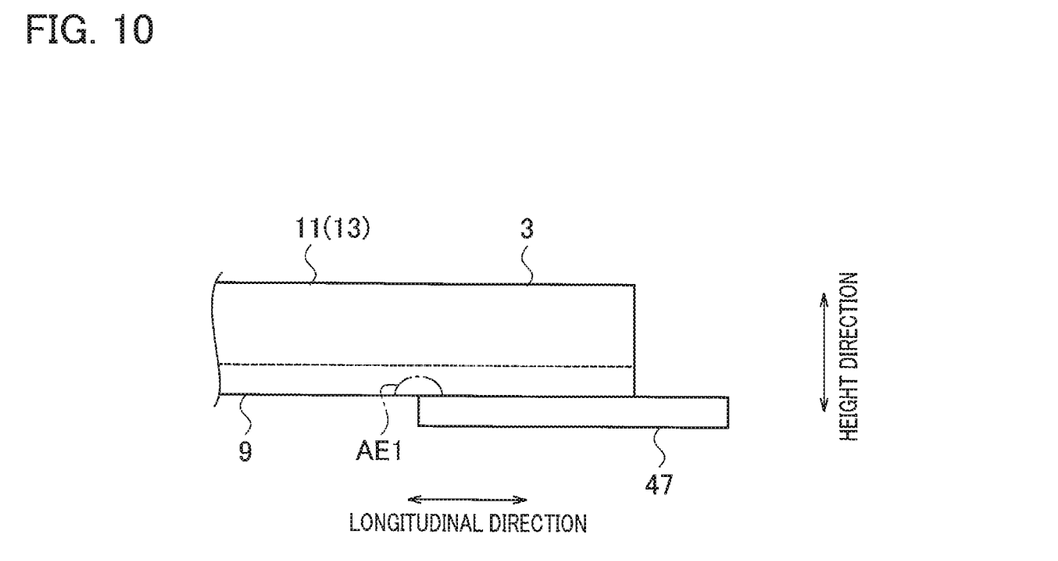
FIG. 10 is a perspective view in the direction of an arrow X in FIG. 9.

In the aspect illustrated in FIGS. 9 and 10, when a fixed current is flowing in the busbar 3, a current on the order of 10.5 MA/m2 flows in the base plate portion 9 of the busbar 3, a current on the order of 10.4 MA/m2 flows in the side plate portions 11 and 13 of the busbar 3, a current on the order of 5.3 MA/m2 flows in the contact surface between the base plate portion 9 of the busbar 3 and the partner busbar 47 (49), and a current on the order of 9.5 MA/m2 flows in the partner busbar 47 (49). Note that the value of the current density flowing in a portion AE1 that is illustrated in FIG. 10 is larger than the value of the current density in the foregoing other portions, but this does not produce any particular problems.

In addition, when a current of 550 A flows continuously for twenty minutes in the busbar 3, the temperature in the busbar 3 rises by 47.5° C. and the temperature in the current sensors 7 and 21 rises by 36.6° C. Here, even when the ambient temperature is assumed to be 70° C., 70° C.+47.5° C.=117.5° C.<150° C., and hence no particular problems arise.

In the aspect illustrated in (a) of FIG. 11 (substantially the same aspect as the aspect illustrated in FIGS. 9 and 10), when a fixed current flows continuously for twenty minutes in the busbar 3, even when the ambient temperature is assumed to be 70° C., a temperature T11 of the busbar 3 is lower than 150° C., a temperature T12 of the first current sensor 7 is lower than 150° C., and a temperature T13 of the second current sensor 21 is lower than 150° C., and hence no particular problems arise.

Even in the aspects illustrated in (b) and (c) of FIG. 11, there are similarly no particular problems relating to a temperature rise. That is, the temperatures T21, T22, T23, T31, T32, and T33 are all lower than 150° C.

As explained in the foregoing, according to the current detection device 1 of the foregoing configuration, because the busbar 3 is thin in thickness t and yet is also bent in its extension, when viewed in the longitudinal direction, large electric currents can be detected without reducing productivity and without enlarging the current detection device 1.

That is, because the thickness dimension t of the busbar 3 has a small value of 3 mm or less, when the busbar 3 is manufactured from a flat plate-shaped blank with a thickness of 3 mm or less, presswork, and the like, of the flat plate-shaped blank is straightforward, and the busbar 3 can be manufactured without reducing productivity. Incidentally, the thickness of the busbar may be set optionally in the range of 3 mm or less and not less than 0.1 mm.

Furthermore, because the busbar 3 is bent (is not straight) when viewed in the longitudinal direction, the value of the lateral dimension of the busbar 3 can be made small in comparison with a case of a linear shape that is long in the lateral direction, and an enlargement of the current detection device 1 can be prevented.

In addition, an enlargement of the space for installing (fixing) the current detection device 1 can be prevented, thereby increasing the versatility of the current detection device 1 and enabling the space around the mounted current detection device 1 to be utilized effectively.

Furthermore, because the busbar 3 is bent when viewed in the longitudinal direction, the cross-sectional area of the busbar 3 in which the electric current flows can be increased, thus allowing the value of the electric current flowing in the busbar 3 to be made large, and hence a large electric current flowing in the busbar 3 can be detected by the current sensor 7.

Furthermore, because the busbar 3 is bent when viewed in the longitudinal direction, an enlargement of the shield member 5 enclosing the busbar 3 can be prevented, and a steep jump in the price of the shield member 5, configured from a comparatively costly material, can be avoided, thus making cost reductions possible.

In addition, according to the current detection device 1 with the foregoing configuration, because the busbar 3 is formed in a U shape when viewed in the longitudinal direction, the shape of the busbar 3 is simplified, and manufacturing (processing) of the busbar 3 is straightforward.

Furthermore, because the busbar 3 is formed in a U shape, linearity (the linearity of the two graphs G1 and G2 illustrated in FIG. 5) of the magnetic flux density (the magnetic flux density detected by the current sensor 7) for the value of the current flowing in the busbar 3 can be attained as illustrated by the test results in FIG. 5, and the value of the current flowing in the busbar 3 can also be detected easily and accurately.

In addition, sometimes there is a slight space surplus in the height direction in conventional current detection devices, and in such cases, the busbar alone of the current detection device can be replaced with the U-shaped busbar of the current detection device according to the foregoing embodiment, and sometimes compatibility with busbar attachments is achievable.

Moreover, when the value of the current flowing in the busbar 3 is large, the cross-sectional area of the busbar can be made large to handle the large current by lengthening at least one of the three segments constituting the U shape.

In addition, according to the current detection device 1, because the current sensor 7 is provided outside the U shape of the busbar 3 when viewed in the longitudinal direction, fitting of the current sensor 7, which is fitted directly to the wiring board 8, is possible while easily avoiding interference with the wiring board 8 and the busbar 3.

Moreover, according to the current detection device 1, the shield member 5 is formed in a ring shape with a portion thereof cut away, when viewed in the longitudinal direction, by providing the opening 15 in a portion of the shield member 5, and the busbar 3 is arranged inside the ring of the shield member 5. Therefore, as illustrated in FIG. 4, the effect of an external magnetic field around the portions of the busbar 3 which pass through the shield member 5 can be reduced as far as possible.

Figure 3:
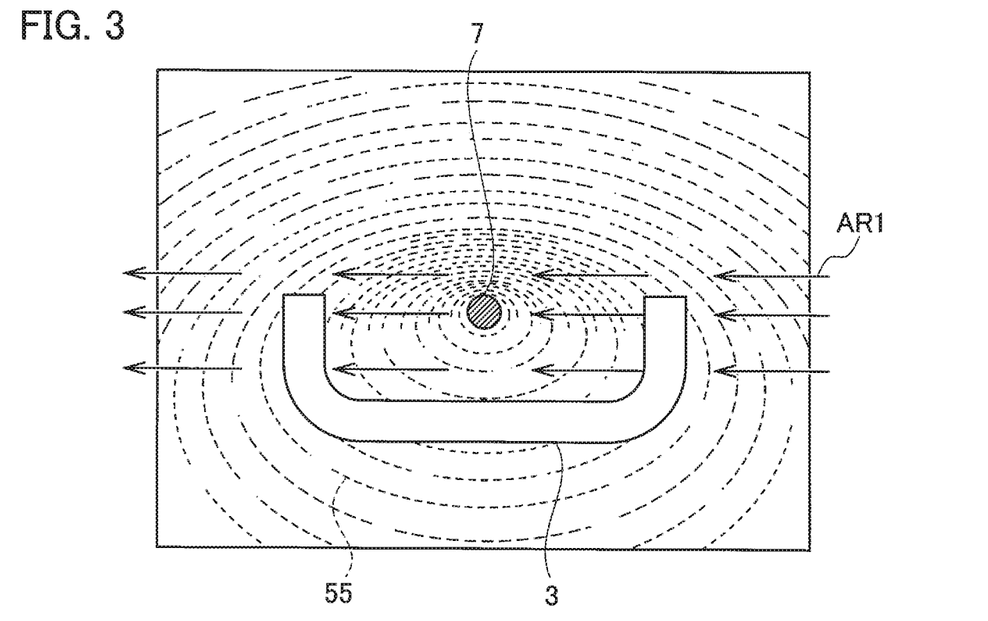
FIG. 3 is a diagram corresponding to FIG. 2B and illustrating a current detection device according to a reference example in which a shield member is not provided, and a magnetic field.

In other words, as illustrated in FIG. 3, in a configuration in which the shield member is not provided, the magnetic flux density is low, and when an external magnetic field (noise) as indicated by the arrow AR1 is exerted, the external magnetic field has an effect, and it becomes difficult to accurately detect the value of the electric current flowing in the busbar 3.

On the other hand, if the shield member 5 is provided as per the current detection device 1 illustrated in FIG. 4, the magnetic flux density (the magnetic flux density around the current sensor 7) is then high, and even if an external magnetic field like that denoted by the arrow AR2 is exerted, the magnetic flux of the external magnetic field passes through the shield member 5 as indicated by the arrow AR3, and there is barely any change in the magnetic flux around the current sensor 7. The value of the current flowing in the busbar 3 can then be accurately detected.

To explain this more fully, according to the current detection device 1, the value of the current flowing in the busbar 3 can be detected in a state where the S/N ratio is large in comparison with a current detection device in which the shield member is not provided like that illustrated in FIG. 3.

Note that although an external magnetic field runs in a lateral direction as indicated by the arrow AR2 in FIG. 4, even when an external magnetic field runs in a height direction or oblique direction in addition to a lateral direction, the magnetic flux of the external magnetic field passes through the shield member 5, and the value of the current flowing in the busbar 3 can be accurately detected. Note also that an illustration of the magnetic field in the shield member 5 has been omitted from FIGS. 3 and 4.

Furthermore, according to the current detection device 1, the current sensor 7 is configured to detect the magnetic field 55 in the vicinity of the opening 15 in the shield member 5. Therefore, the magnetic field 55 can be detected in portions where the strength of the magnetic field 55 generated by the current flowing in the busbar 3 is high (portions where the magnetic flux density is large). As a result, the value of the current flowing in the busbar 3 can be detected in a state where the value of the S/N ratio is large.

Furthermore, according to the current detection device 1, the second current sensor 21 is configured to detect the magnetic field 55 between the pair of side plate portions 23 and 25 forming the U shape of the second portion 19 of the shield member 5. Therefore, when the value of the current flowing in the busbar 3 is large, the value of the current flowing in the busbar 3 can be detected in a state where the value of the S/N ratio is large.

The current detection device 1 of the aspect illustrated in FIG. 12A will be explained next. The current detection device 1 of the aspect illustrated in FIG. 12A is obtained by rotating the busbar 3 of the current detection device 1 of the aspect illustrated in FIG. 2B through 180°, with the longitudinal direction serving as the central axis of rotation. In other respects, the current detection device 1 of the aspect illustrated in FIG. 12A is configured in the same way as the current detection device 1 of the aspect illustrated in FIG. 2B, and exhibits similar effects.

Figure 13:
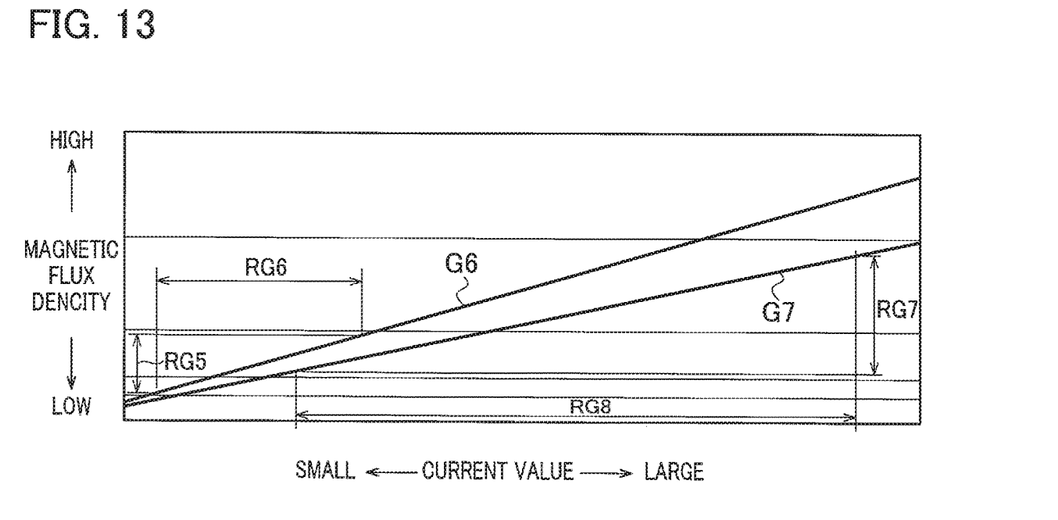
FIG. 13 is a diagram illustrating a relationship between an electric current flowing in the busbar of a current detection device according to a modified example illustrated in FIG. 12A, and magnetic flux density.

Here, the relationship between the electric current values in the first current sensor 7 and the second current sensor 21 of the current detection device 1 of the aspect illustrated in FIG. 12A, and the magnetic flux density, will be explained with reference to FIG. 13. The graph G6 illustrated in FIG. 13 is for the first current sensor 7, and the graph G7 illustrated in FIG. 13 is for the second current sensor 21.

As a result of the first current sensor 7 detecting the magnetic flux density in a range RG5, the value of a current in a range RG6 that flows in the busbar 3 can be measured. As a result of the second current sensor 21 detecting the magnetic flux density in a range RG7, the value of a current in a range RG8 that flows in the busbar 3 can be measured. Note that the graphs G6 and G7 are also linear (exhibit linearity) like the graphs G1 and G2 illustrated in FIG. 5.

Figure 14:
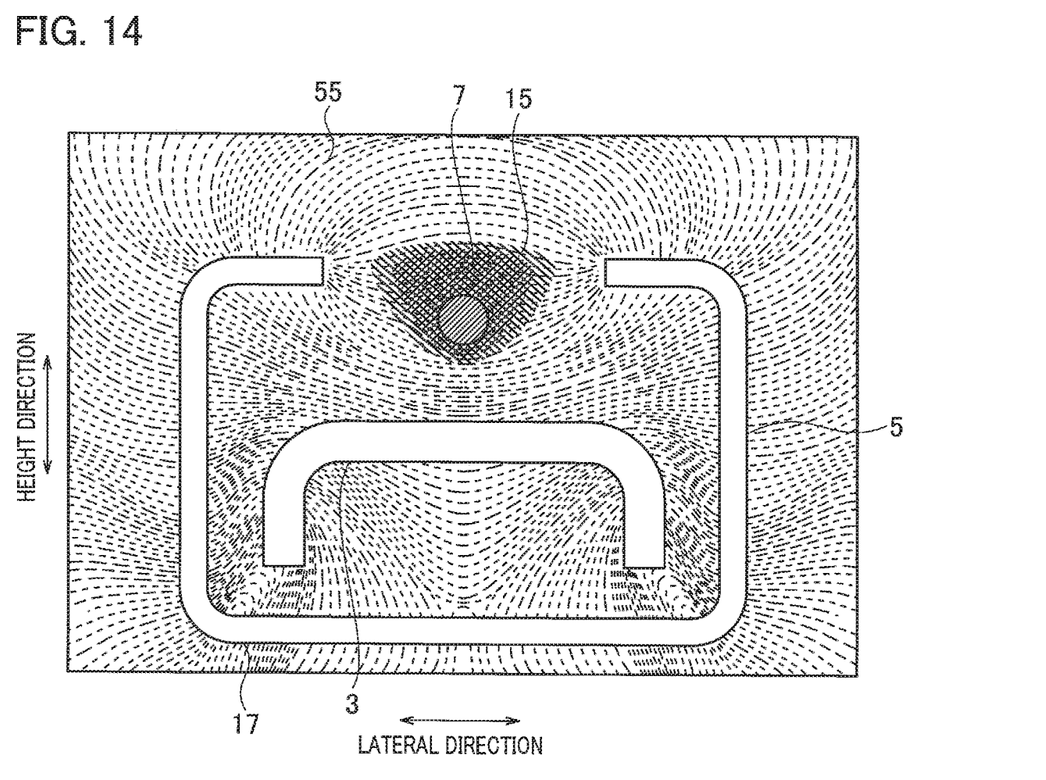
FIG. 14 is a cross-sectional view corresponding to FIG. 2B, and illustrating the current detection device according to the modified example illustrated in FIG. 12A, and a magnetic field.

Furthermore, when current flows in the current detection device 1 of the aspect illustrated in FIG. 12A, the magnetic field 55 is generated as illustrated in FIG. 14. As per the current detection device 1 of the aspect illustrated in FIG. 2B, the magnetic flux density of the magnetic field 55 varies according to the value of the current flowing in the busbar 3, and is large at the opening 15 of the shield member 5 except for the solid portion of the shield member 5. As a result of the first current sensor 7 detecting the magnetic flux density at the opening 15 of the shield member 5, the value of the current flowing in the busbar 3 is determined. Note that an illustration of the magnetic field in the shield member 5 has been omitted from FIG. 14.

The temperature variation in the current detection device 1 of the aspect illustrated in FIG. 12A when a fixed current continuously flows in the busbar 3 of the current detection device 1 will be explained next with reference to FIG. 15. Measurement of the temperature of the current detection device 1 is taken at three points, namely, the busbar 3, the first current sensor 7, and the second current sensor 21.

Figure 15:
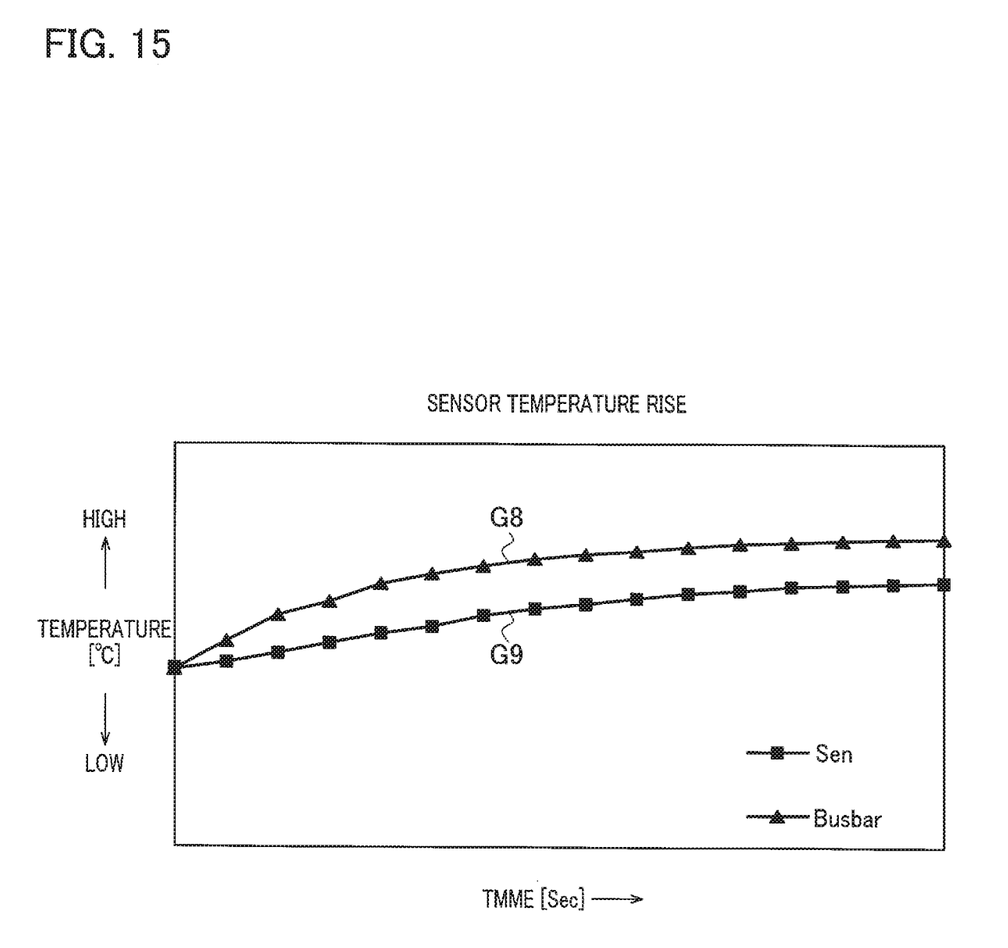
FIG. 15 is a diagram illustrating a temperature rise in the current detection device according to the modified example illustrated in FIG. 12A.

Graph G8, which is illustrated in FIG. 15, illustrates the temperature variation (temperature rise) of the busbar 3. Graph G9, which is illustrated in FIG. 15, illustrates the temperature variation (temperature rise) of the first current sensor 7 and the second current sensor 21.

Incidentally, in the foregoing explanation, although a case where the busbar 3 is formed in a U shape when viewed in the longitudinal direction was explained by way of an example, the busbar 3 may also be formed in a shape other than a U shape when viewed in the longitudinal direction, as illustrated in FIGS. 16A to 16I.

Figure 16A:
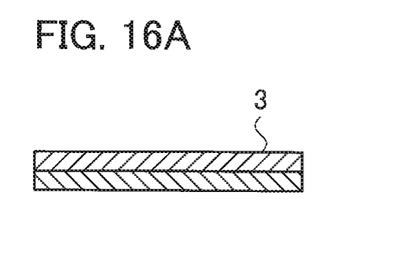
FIGS. 16A to 16I are diagrams illustrating busbars according to modified examples.
Figure 16B:
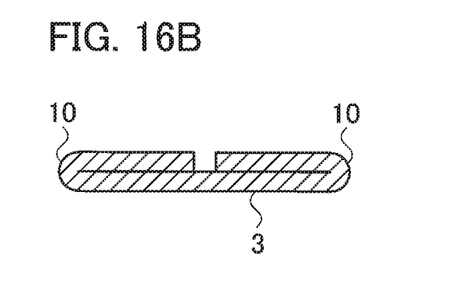
Figure 16C:
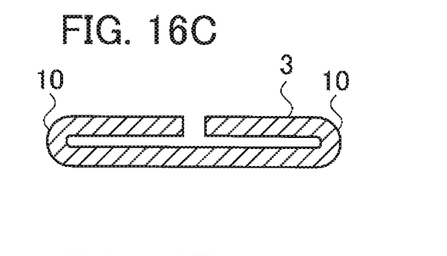
Figure 16D:
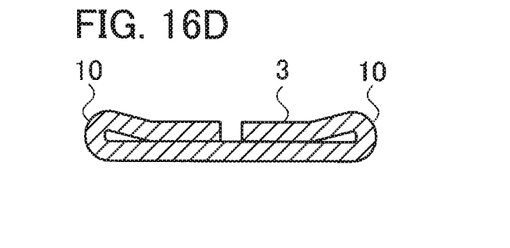

As illustrated in FIGS. 16B, 16C, and 16D, the busbar 3 may also be formed in an aspect in which the two ends in the lateral direction have been bent through 180° when viewed in the longitudinal direction.

In the aspect illustrated in FIG. 16B, mutually overlapping portions contact one another; in the aspect illustrated in FIG. 16C, mutually overlapping portions are slightly spaced apart (slightly spaced apart in the height direction); in the aspect illustrated in FIG. 16D, mutually overlapping portions are slightly spaced apart in the vicinity of the bent portions and mutually overlapping portions contact one another in portions that are spaced apart from the bent portions.

Figure 16E:
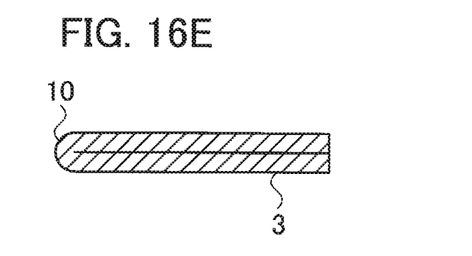
Figure 16F:
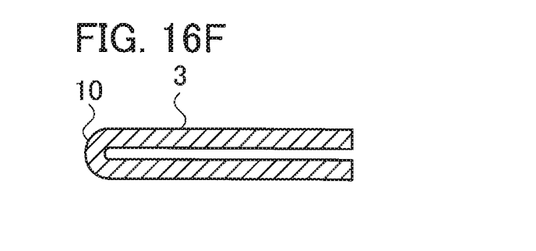

Furthermore, as illustrated in FIGS. 16E and 16F, the busbar 3 may also be formed in an aspect in which the busbar 3 is bent through 180° at one point in the lateral direction, when viewed in the longitudinal direction. In the aspect illustrated in FIG. 16E, mutually overlapping portions contact one another, and in the aspect illustrated in FIG. 16F, mutually overlapping portions are slightly spaced apart.

Figure 16G:
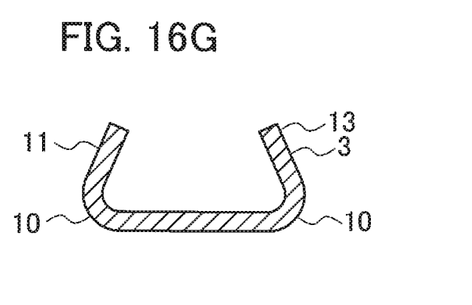
Figure 16H:
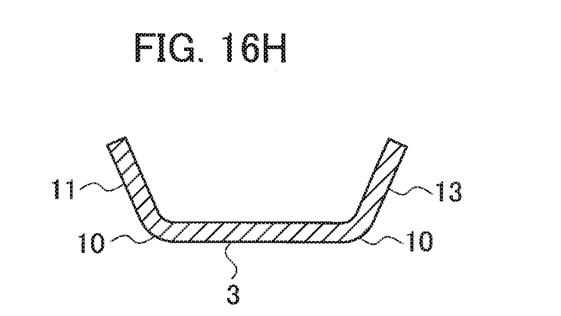
Figure 16I:
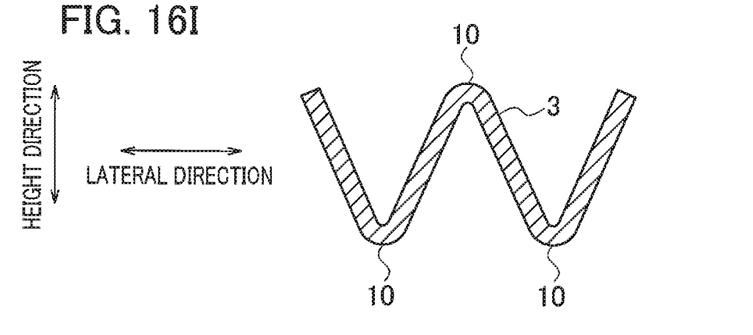

Furthermore, as illustrated in FIGS. 16G and 16H, the side plate portions 11 and 13 may also be bent at an angle other than 90° relative to the base plate portion 9 of the busbar 3 when viewed in the longitudinal direction, and, as illustrated in FIG. 16I, the busbar 3 may also be formed in a "W" shape, for example, as a result of being bent at a plurality of points other than three points when viewed in the longitudinal direction.

In addition, other than the aspects illustrated in FIGS. 16A to 16I, the busbar 3 may also be formed symmetrically with respect to a plane (central plane) lying orthogonal to the lateral direction and including the center (center axis extending in the longitudinal direction) of the busbar 3.

Furthermore, the busbars 3 illustrated in FIGS. 16B to 16I may also be fitted in an aspect in which the busbar 3 has been rotated through any angle such as 30°, 45°, 60°, 90°, and 120° about the center axis thereof which extends in the longitudinal direction.

Moreover, as illustrated in FIG. 16A, the busbar 3 may also be formed by overlapping a plurality of two or more thin members. In other words, the busbar 3 is configured by overlapping, in the thickness direction, a plurality of thin members of 3 mm or less which are easy to process, when viewed in the longitudinal direction. Note that, in the busbar 3 illustrated in FIG. 16A, at least one thin member may also be bent when viewed in the longitudinal direction.

In addition, in the embodiments described above, the thickness of the busbar may be set optionally in the range of 3 mm or less and not less than 0.1 mm.

What is claimed is:
1. A current detection device comprising:
   a shield member;
   a busbar that extends in a longitudinal direction through
      an interior of the shield member and which is thin in thickness and is bent so as to include a bend extending in the longitudinal direction, the bend extending along a majority of a length of the busbar; and a current sensor that detects a magnetic field generated by an electric current flowing in the busbar in the direction of extension, wherein the shield member has a first portion at one end thereof in the direction of extension and has a second portion at another end thereof, the first portion is formed in a ring shape with a portion thereof cut away, when viewed in the direction of extension, by providing an opening in a portion thereof, the second portion is formed in a U shape when viewed in the direction of extension, the current sensor has a first current sensor and a second current sensor, the first current sensor is configured to detect a magnetic field at the opening of the first portion or a magnetic field in the vicinity of the opening of the first portion, and the second current sensor is configured to detect a magnetic field between a pair of side plate portions that form the U shape of the second portion.

2. The current detection device according to claim 1, wherein the busbar is bent at at least one point when viewed in the direction of extension.

3. The current detection device according to claim 2, wherein the busbar is bent at a plurality of points when viewed in the direction of extension.

4. The current detection device according to claim 2, wherein the busbar is bent at two points when viewed in the direction of extension.

5. The current detection device according to claim 1, wherein the busbar is formed in a U shape when viewed in the direction of extension.

6. The current detection device according to claim 5, wherein the current sensor is provided outside the U shape of the busbar when viewed in the direction of extension.

7. The current detection device according to claim 1, wherein the shield member is formed in a ring shape with a portion thereof cut away, when viewed in the direction of extension, by providing an opening in a portion of the shield member, and the busbar is arranged inside the ring of the shield member when viewed in the direction of extension.

8. The current detection device according to claim 7, wherein the current sensor is configured to detect a magnetic field at the opening of the shield member or a magnetic field in the vicinity of the opening of the shield member.

9. The current detection device according to claim 1, wherein the busbar has a thickness of 3 mm or less.

\* \* \* \* \*